United States Patent
Tan et al.

(10) Patent No.: US 8,482,923 B2
(45) Date of Patent: Jul. 9, 2013

(54) HEAT SINK CLIP WITH WIRE CLIP

(75) Inventors: Liang Tan, Shenzhen (CN); Xiao-Feng Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 203 days.

(21) Appl. No.: 13/207,466

(22) Filed: Aug. 11, 2011

(65) Prior Publication Data

US 2013/0003302 A1   Jan. 3, 2013

(30) Foreign Application Priority Data

Jun. 30, 2011   (CN) .......................... 2011 1 0181513

(51) Int. Cl.
   *H05K 7/20*   (2006.01)

(52) U.S. Cl.
   USPC ...... 361/704; 361/679.54; 361/709; 361/710; 361/719; 361/720; 165/80.3; 165/104.33; 165/185; 257/718; 257/719; 174/16.3; 24/510; 24/548; 248/505; 248/506; 248/510; 29/592.1; 29/832; 29/890.02; 29/890.03

(58) Field of Classification Search
   USPC ....... 361/679.46–679.54, 690–697, 704–712, 361/717–724; 165/80.2, 80.3, 80.4, 104.33, 165/185, 121–126; 257/706–727; 174/15.1, 174/16.3, 250–267; 29/832, 890.02, 890.03, 29/592.1; 24/296, 456, 459, 520, 548, 510; 248/505, 510, 506
   See application file for complete search history.

(56) References Cited

U.S. PATENT DOCUMENTS

| | | | | |
|---|---|---|---|---|
| 4,716,494 A * | 12/1987 | Bright et al. | ................... | 361/704 |
| 5,241,453 A * | 8/1993 | Bright et al. | ................... | 361/704 |
| 6,381,813 B1 * | 5/2002 | Lai | ................... | 24/456 |
| 6,600,652 B2 * | 7/2003 | Chandran et al. | ............. | 361/704 |
| 6,788,538 B1 * | 9/2004 | Gibbs et al. | ................... | 361/704 |
| 7,203,066 B2 * | 4/2007 | Lee et al. | ........................ | 361/704 |
| 7,233,496 B2 * | 6/2007 | Lee et al. | ........................ | 361/720 |
| 7,672,136 B2 * | 3/2010 | He et al. | ......................... | 361/719 |
| 8,164,905 B2 * | 4/2012 | Yang | .............................. | 361/719 |
| 8,201,617 B2 * | 6/2012 | Ye et al. | ......................... | 165/80.3 |
| 2009/0154109 A1 * | 6/2009 | Chen et al. | ..................... | 361/709 |
| 2010/0172102 A1 * | 7/2010 | Sass et al. | ...................... | 361/709 |

* cited by examiner

*Primary Examiner* — Michail V Datskovskiy
(74) *Attorney, Agent, or Firm* — Altis Law Group, Inc.

(57) ABSTRACT

Provided is a heat sink clip for fastening a heat sink on a printed circuit board (PCB). The heat sink clip includes two hooks and a wire clip. The two hooks are inversely fixed to the PCB at two opposite sides of the heat sink. The wire clip includes a pressing wire pressing the heat sink, two pairs of deforming wires extending from the lateral of the pressing wire along two radial directions of the pressing wire and away from the PCB, and two engaging wires engaging with the respective hooks such that the deforming wires are bent towards the PCB.

10 Claims, 3 Drawing Sheets

HEAT SINK CLIP WITH WIRE CLIP

BACKGROUND

1. Technical Field

The present disclosure relates to heat sink clips and, particularly, to a heat sink clip having a wire clip.

2. Description of Related Art

Heat sink clips are widely used to fasten a heat sink to a chip. However, typical heat sink clips have a complicated structure and are inconvenient to operate.

Therefore, it is desirable to provide a heats ink clip, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
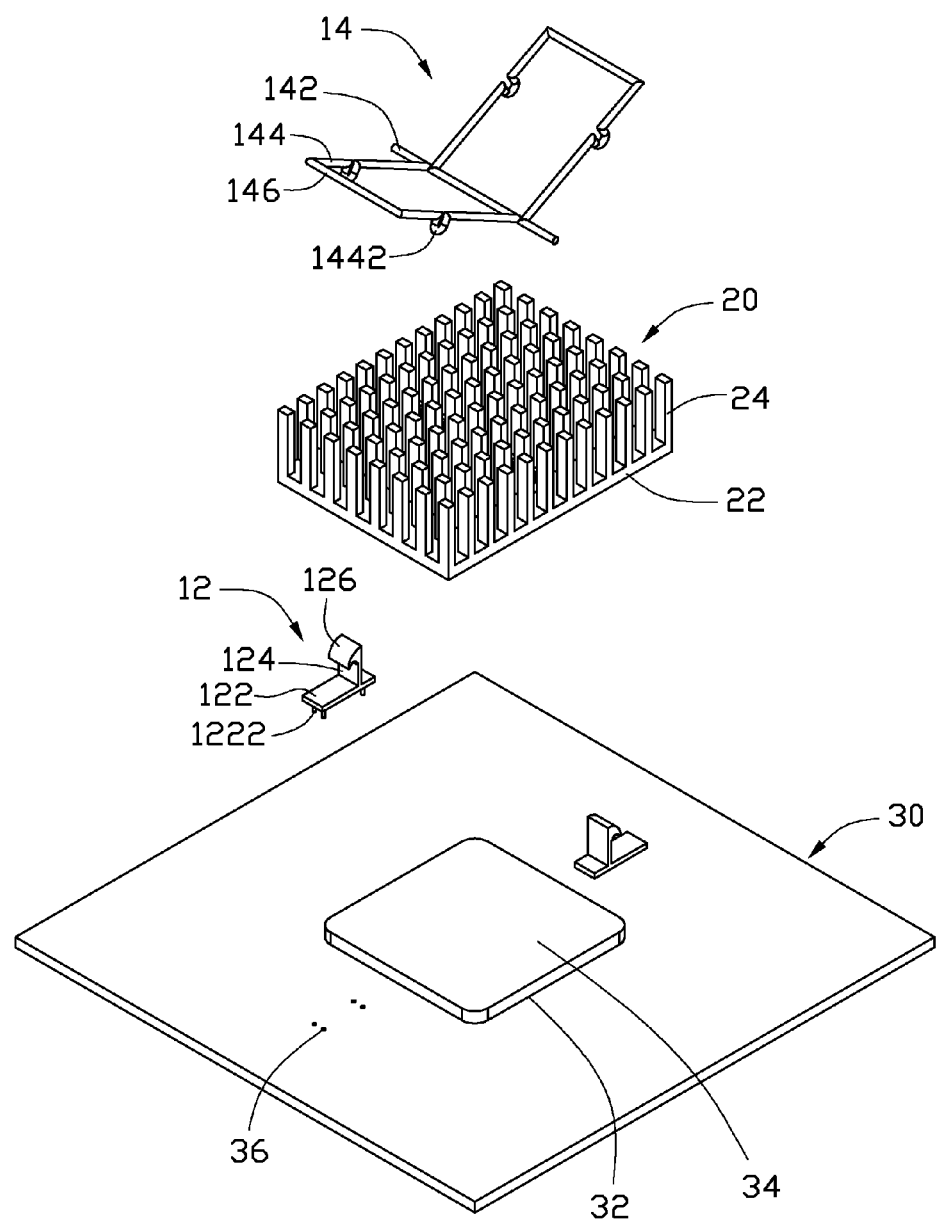
FIG. 1 is an isometric, schematic view of a heat sink clip, a printed circuit board (PCB), and a heat sink, according to an embodiment.
Figure 2:
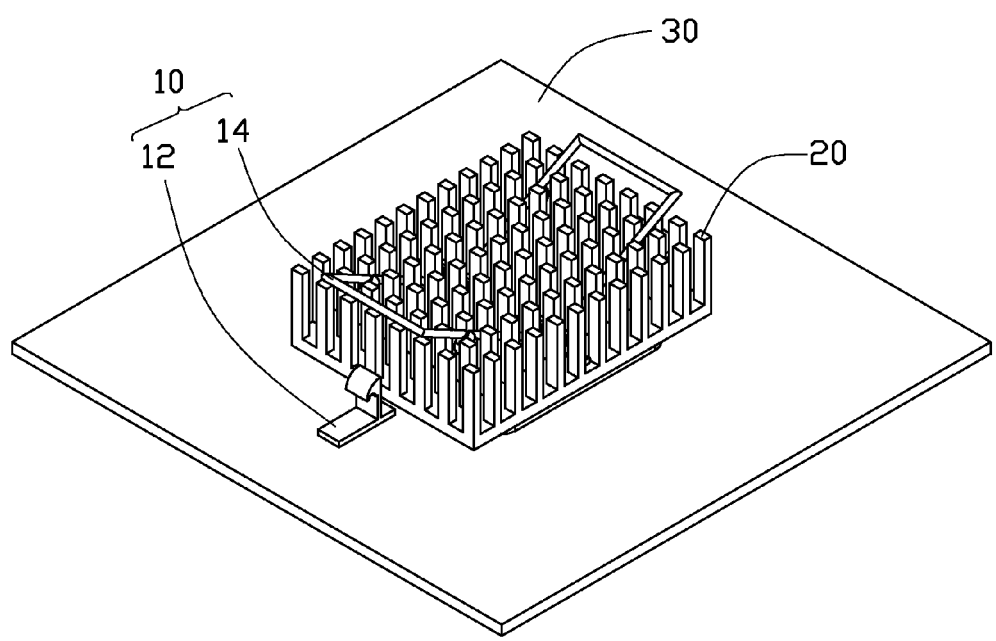
FIG. 2 is similar to FIG. 1, but showing that the heat sink assembled with the PCB, and the heat sink clip placed on the heat sink.
Figure 3:
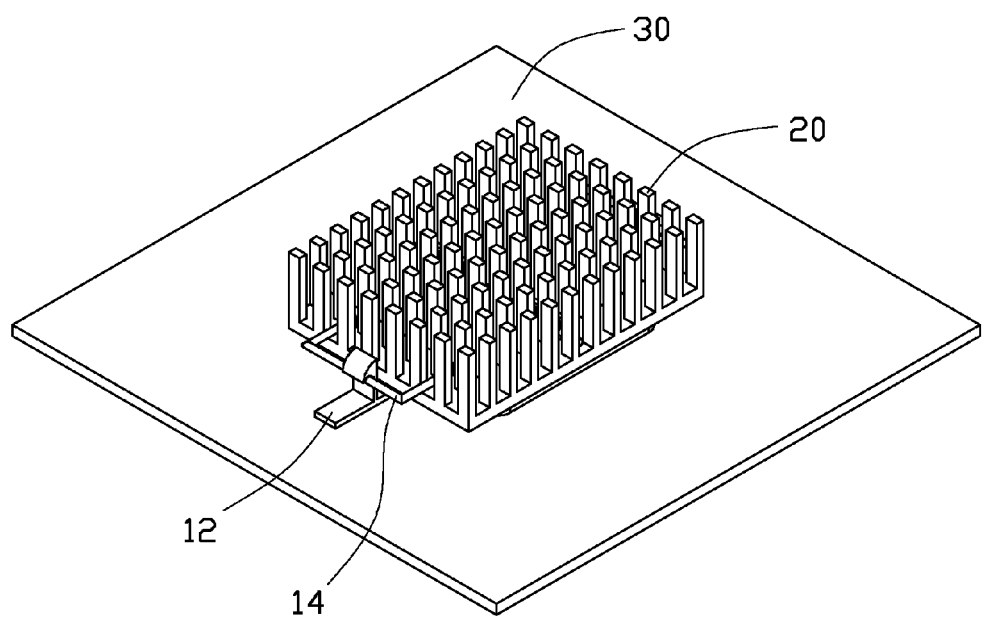
FIG. 3 is similar to FIG. 2, but showing that the heat sink clip assembled with the heat sink.

Referring to FIGS. 1-3, a heat sink clip 10, according to an embodiment, is configured for fastening a heat sink 20 to a PCB 30. The heat sink 20 includes a heat-transfer base 22 and a number of fins 24 extending up from a surface of the heat-transfer base 22.

The heat sink clip 10 includes two hooks 12 and a wire clip 14. The wire clip 14 is made of elastic wires and includes a pressing wire 142, two pairs of deforming wires 144, and two engaging wires 146. The pairs of deforming wires 144 extend from the lateral of the pressing wire 142. The deforming wires 144 in each pair are arranged in parallel with a respective radial direction of the pressing wire 142 and form an obtuse angle with the deforming wires 144 in the other pair. Each engaging wire 146 is arranged in parallel with the pressing wire 142 and connects to ends of a corresponding pair of deforming wires 144, which are distant from the pressing wire 142.

In assembly, the heat sink 20 is disposed on the PCB 30 such that the fins 24 extend away from the PCB 30. The hooks 12 are fixed to the PCB 30 at two opposite sides of the heat-transfer base 22. The wire clip 14 is placed between the fins 24 and on the heat-transfer base 22. The pressing wire 142 is arranged on the heat-transfer base 22 and substantially perpendicular to a connection line of the two hooks 12. The deforming wires 144 extend away from the heat-transfer base 22. That is, the pairs of deforming wires 144 extend from the lateral side of the pressing wire 142 along two respective opposite radial directions of the pressing wire 142 and away from the heat-transfer base 22. Then, the engaging wires 146 are pressed downward, i.e., toward the heat-transfer base 22, and the deforming wires 144 bend until the engaging wires 146 are engaged with the respective hooks 12. Thus, the heat sink 20 is fastened to the PCB 30 by the heat sink clip 10.

The PCB 30, such as a computer motherboard, includes a socket 32, such as a central processing unit (CPU) socket, and a chip 34, such as a CPU, in the socket 32. The heat-transfer base 22 is placed on the chip 34 to efficiently transfer heat generated by the chip 34 to the fins 24. Thus, the fins 34 can dissipate the heat. Generally, the chip 34 is rectangular and, accordingly, the heat-transfer base 22 is also rectangular and the fins 24 are arranged in a rectangular array.

Each hook 12 includes a support base 122, a support plate 124 extending up from a surface of the support base 122, and a hook portion 126 formed at an end of the support plate 122 distant from the support base 122. The support plates 122 are fixed to the PCB 30 such that the support plates 124 extend away from the PCB 30.

Each support base 122 is rectangular and includes four pins 1222 extending down from a surface thereof opposite to the corresponding support plate 124. The PCB 30 defines two groups of four through holes 36. The support bases 122 are fixed to the PCB 30 by inserting the corresponding pins 1222 through the corresponding group of through holes 36. In particular, each hook 12 can be formed by plastic. The pins 1222 can be melted and then solidified such that the pins 122 are adhered to the PCB 30 and the hooks 12 are thus tightly fixed to the PCB 30.

Each hook portion 126 is bent away from the other hook 12 towards the support base 122. In other words, the hooks 12 are inversely arranged in a back-to-back fashion.

However, the configuration of the hooks 12 is not limited to this embodiment. In other embodiments, the support bases 122 can take other suitable shapes and fixed to the PCB 30 by other numbers of pins 122 or by other suitable methods, such as riveting. Also, the hooks 12 can be inversely arranged in a face-to-face fashion. That is, the hook portions 126 are bent toward each other and downwards.

The pressing wire 142 can be arranged along a central line of the heat-transfer base 22 and extend along the full length or width of the heat-transfer base 22 to apply a uniform pressure on the heat-transfer base 22.

A height of each hook 12 is substantially equal to or slightly taller than a total height of the chip 34 and the heat-transfer base 22 along a direction substantially perpendicular to the PCB 30. Thus, the deforming wires 144 are prevented from being bent by the edge of the heat-transfer base 22.

The wire clip 14 is not limited to this embodiment. In other embodiments, each deforming wire 144 can form a curved portion 1442 curved toward the heat-transfer base 22, generally at the center thereof. Thus, when the engaging wires 146 are engaged with the respective hooks 12, the curved portions 1442 press against the heat-transfer base 22 to further improve the uniformity of the pressure on the heat-transfer base 22. In this situation, a height of each hook 12 is substantially equal to or slightly taller than a total height of the chip 34, the heat-transfer base 22, and each curved portion 1442 along a direction substantially perpendicular to the PCB 30. Thus, the deforming wires 144 are prevented from being bent by the edge of the heat-transfer base 22.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A heat sink clip for securing a heat sink on a printed circuit board (PCB), the heat sink comprising a heat-transfer base in contact with the PCB and a plurality of fins extending up from a surface of the heat-transfer base opposite to the PCB, the heat sink clip comprising:
   two hooks for being arranged on the (PCB) at two opposite sides of the heat sink; and
   an elastic wire clip for being arranged between the fins, the wire clip comprising:
      a pressing wire for being placed on the heat-transfer base;
      two pairs of deforming wires extending from a lateral of the pressing wire along two respective radial directions of the pressing wire; and
      two engaging wires, each of which is positioned at ends of a corresponding pair of deforming wires distant from the pressing wire, each engaging wire configured to engage with a corresponding hook to force the corresponding pair of deforming wires to bend towards the heat-transfer base.

2. The heat sink clip of claim 1, wherein each hook comprises a support base for being fixed to the PCB, a support plate extending up from a surface the support base, and a hook portion positioned at an end of the support plate distant from the support base.

3. The heat sink clip of claim 2, wherein each support base comprises a plurality of pins extending up from a surface thereof opposite to the support plate.

4. The heat sink clip of claim 3, wherein each hook is made of plastic.

5. The heat sink clip of claim 2, wherein each hook portion is bent away from the other hook portion and toward the corresponding support base when the heat sink clip secures the heat sink on the PCB.

6. The heat sink clip of claim 1, wherein the pressing wire is arranged along a central line of the heat-transfer base and extends along the full length or width of the heat-transfer base when the heat sink clip secures the heat sink on the PCB.

7. The heat sink clip of claim 1, wherein a height of each hook is substantially equal to or slightly taller than a total height of the heat-transfer base and a chip sandwiched between the PCB and the heat-transfer base.

8. The heat sink clip of claim 1, wherein each deforming wire comprises a curved portion configured to presses against the heat-transfer base when the engaging wires engage with the respective hooks.

9. The heat sink clip of claim 8, wherein a height of each hook is substantially equal to or slightly taller than a total height of the heat-transfer base, each curved portion, and a chip sandwiched between the PCB and the heat-transfer base.

10. The heat sink clip of claim 1, wherein an obtuse angle is formed between the two pairs of deforming wires.

* * * * *